(12) United States Patent
Choi et al.

(10) Patent No.: US 10,388,705 B2
(45) Date of Patent: Aug. 20, 2019

(54) DISPLAY PANEL AND METHOD FOR MANUFACTURING THEREOF

(71) Applicant: LG Display Co., Ltd., Seoul (KR)

(72) Inventors: Ho Won Choi, Gyeonggi-do (KR); Hye Sook Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/721,077

(22) Filed: May 26, 2015

(65) Prior Publication Data

US 2015/0349029 A1 Dec. 3, 2015

(30) Foreign Application Priority Data

May 27, 2014 (KR) .................. 10-2014-0063991
Oct. 21, 2014 (KR) .................. 10-2014-0142749

(51) Int. Cl.
*H01L 27/32* (2006.01)
*H01L 51/52* (2006.01)
*H01L 33/44* (2010.01)
*H01L 51/56* (2006.01)

(52) U.S. Cl.
CPC ........ *H01L 27/322* (2013.01); *H01L 27/3213* (2013.01); *H01L 27/3241* (2013.01); *H01L 27/3244* (2013.01); *H01L 33/44* (2013.01); *H01L 51/5281* (2013.01); *H01L 51/5284* (2013.01); *H01L 2251/558* (2013.01)

(58) Field of Classification Search
CPC ............... H01L 27/322; H01L 27/3211; H01L 27/3213; H01L 27/3216; H01L 51/5281; H01L 2251/558; H01L 51/5284; H01L 33/44; H01L 27/3244; H01L 27/3241; G02F 2001/136222; G02F 2201/52; G02B 2006/12109

See application file for complete search history.

(56) References Cited

U.S. PATENT DOCUMENTS

| | | | | |
|---|---|---|---|---|
| 7,091,523 | B2 * | 8/2006 | Cok | ............... H01L 27/322 257/79 |
| 2003/0020855 | A1 | 1/2003 | Lee | |
| 2003/0107688 | A1 * | 6/2003 | Yamagishi | ........ G02F 1/133555 349/62 |
| 2004/0135937 | A1 * | 7/2004 | Lee | ............... G02F 1/133514 349/106 |

(Continued)

FOREIGN PATENT DOCUMENTS

| | | | |
|---|---|---|---|
| CN | 102969334 A | * | 3/2013 |
| JP | 2014074880 A | * | 4/2014 |

(Continued)

*Primary Examiner* — Allen L Parker
*Assistant Examiner* — Pauline Vu
(74) *Attorney, Agent, or Firm* — Morgan, Lewis & Bockius LLP

(57) ABSTRACT

A display panel includes a substrate with a plurality of color sub pixel regions and a white sub pixel region constituting a unit pixel; a color filter layer with a color filter provided in each of the plurality of color sub pixel regions; and a reflection reduction layer provided in the white sub pixel region. The reflection reduction layer includes at least one color filter selected from the color filter layer, and a thickness of the reflection reduction layer is smaller than a thickness of the selected color filter.

19 Claims, 7 Drawing Sheets

(56) References Cited

U.S. PATENT DOCUMENTS

| | | | | |
|---|---|---|---|---|
| 2005/0083457 A1* | 4/2005 | Fujimori | G02F 1/133555 | 349/113 |
| 2005/0122445 A1* | 6/2005 | Park | G02F 1/133514 | 349/106 |
| 2005/0218768 A1* | 10/2005 | Saito | H01L 27/3213 | 313/112 |
| 2005/0270449 A1* | 12/2005 | Koma | G02F 1/133371 | 349/114 |
| 2006/0187155 A1* | 8/2006 | Chang | G09G 3/3208 | 345/76 |
| 2007/0008461 A1* | 1/2007 | Kobayashi | G02F 1/133514 | 349/106 |
| 2007/0008463 A1* | 1/2007 | Tanaka | G02F 1/133514 | 349/107 |
| 2007/0058115 A1* | 3/2007 | Utsumi | G02F 1/133514 | 349/109 |
| 2008/0218070 A1* | 9/2008 | Kobayashi | H01L 27/3213 | 313/506 |
| 2008/0297706 A1* | 12/2008 | Li | G02F 1/133371 | 349/106 |
| 2009/0015770 A1* | 1/2009 | Ito | G02F 1/133514 | 349/108 |
| 2009/0051275 A1* | 2/2009 | Kobayashi | H01L 51/5265 | 313/504 |
| 2009/0072693 A1* | 3/2009 | Cok | H01L 27/3213 | 313/110 |
| 2009/0091238 A1* | 4/2009 | Cok | H01L 51/5265 | 313/498 |
| 2009/0102352 A1* | 4/2009 | Cok | H05B 33/22 | 313/498 |
| 2009/0128752 A1* | 5/2009 | Itou | G02B 5/201 | 349/106 |
| 2010/0053038 A1* | 3/2010 | Sakamoto | H01L 51/5265 | 345/76 |
| 2010/0053043 A1* | 3/2010 | Sakamoto | H01L 27/3213 | 345/77 |
| 2010/0182549 A1* | 7/2010 | Miyashita | G02F 1/133514 | 349/106 |
| 2010/0238389 A1* | 9/2010 | Chan | G02F 1/133514 | 349/107 |
| 2011/0316413 A1* | 12/2011 | Ghosh | H01L 51/5284 | 313/498 |
| 2012/0280259 A1* | 11/2012 | Hatta | H01L 27/3213 | 257/89 |
| 2013/0016315 A1* | 1/2013 | Nakagawa | G02F 1/133514 | 349/106 |
| 2013/0020933 A1* | 1/2013 | Levermore | H01L 27/3213 | 313/504 |
| 2013/0119857 A1* | 5/2013 | Su | H05B 33/10 | 313/504 |
| 2013/0120981 A1* | 5/2013 | Kim | F21V 9/08 | 362/231 |
| 2013/0335680 A1* | 12/2013 | Su | H01L 51/5036 | 349/69 |
| 2014/0145586 A1* | 5/2014 | Choi | G09G 3/3208 | 313/504 |
| 2014/0183499 A1* | 7/2014 | Kim | H01L 27/3213 | 257/40 |
| 2014/0184972 A1* | 7/2014 | Park | G02F 1/133514 | 349/43 |
| 2014/0231790 A1* | 8/2014 | Fujino | H01L 51/5284 | 257/40 |
| 2014/0247200 A1* | 9/2014 | Jinta | H01L 25/048 | 345/76 |
| 2015/0090970 A1* | 4/2015 | Park | H01L 27/322 | 257/40 |
| 2015/0155346 A1* | 6/2015 | Motoyama | H01L 51/5265 | 257/89 |
| 2015/0318447 A1* | 11/2015 | Choi | H01L 27/322 | 257/98 |

FOREIGN PATENT DOCUMENTS

| | | | |
|---|---|---|---|
| KR | 10-2002-0089622 A | 11/2002 | |
| KR | 20100069337 A * | 6/2010 | H01L 21/02107 |
| KR | 20120134222 A * | 12/2012 | |

* cited by examiner

DISPLAY PANEL AND METHOD FOR MANUFACTURING THEREOF

CROSS REFERENCE TO RELATED APPLICATIONS

This application claims the benefit of the Korean Patent Application Nos. 10-2014-0063991 filed on May 27, 2014 and 10-2014-0142749 filed on Oct. 21, 2014, which is hereby incorporated by reference as if fully set forth herein.

BACKGROUND

Field of the Disclosure

The present invention relates to a display panel and a method for manufacturing thereof, and more particularly, to a display panel having a slim profile and low reflectance for an external light and good external visibility, and a method for manufacturing thereof.

Discussion of the Related Art

Recently, display panels, such as liquid crystal display (LCD) and organic light emitting diode display (OLED), have attracted as great attentions as flat display panels.

Especially, the display panels using an organic light emitting diode are advantageous in that they have no need for an additional light source, and they realize good picture quality and low power consumption.

The display panel using the organic light emitting diode is realized by forming a thin film transistor (TFT) and an organic light emitting layer on a substrate. If using a white organic light emitting device, a color is expressed by the use of color filter.

The display panel using the color filter and the white organic light emitting device may be formed in a 3-subpixel structure comprising red, green and blue sub pixels, or a 4-subpixel structure comprising red, green, blue and white sub pixels.

In case of the 4-subpixel structure comprising the red, green, blue and white sub pixels, a white color may be expressed on the display panel by driving only the white sub pixel without driving the red, green and blue sub pixels, to thereby reduce power consumption of the display panel.

However, a color filter layer is not required for the white sub pixel. Thus, there may be a problem relating a light reflection by a pixel internal electrode for an external light. Also, there may be a problem relating visibility to a user using the display panel due to the increase of reflectance for an external light. In order to overcome the problem relating the visibility caused by the reflectance for an external light, a polarizing plate (pol) may be provided in the display panel.

However, since the polarizing plate is thick, and is not flexible, the display panel is increased in its thickness due to the polarizing plate, and a manufacturing cost of the display panel is increased. Furthermore, it is difficult to realize a flexible display panel.

In case of the display panel using the organic light emitting device and including the white sub pixel, the color filter layer is not formed in the white sub pixel, whereby an internal reflectance for the external light in the white sub pixel is relatively higher than that of a neighboring sub pixel.

An incidence and reflection path of the external light in the white sub pixel will be described in brief. First, the external light is incident on the organic light emitting device via a substrate, and then the incident light is reflected on a common electrode of the organic light emitting device to the outside.

For improvement of visibility by the external light, the polarizing plate may be additionally provided outside the substrate so as to reduce the reflectance. In this case, the manufacturing cost of the device is increased due to the polarizing plate. Also, since the polarizing plate is thick and is not flexible, it is difficult to realize the flexible display panel with slimness.

RELATED PATENT DOCUMENTS

Cholesteric liquid crystal color filter and method for manufacturing thereof (Korean Patent Application No. 10-2001-0028401 published as KR 10-2002-0089622-A, which is related to US2003020855)

SUMMARY

Accordingly, embodiments of the present invention are directed to a display panel that substantially obviate one or more problems due to limitations and disadvantages of the related art, and a method for manufacturing thereof.

An object of the present invention is to provide a display panel which is slim, and has reduced reflectance for external light, and improved external visibility, and a method for manufacturing thereof.

Another object of the present invention is to provide a display panel which facilitates improved visibility by reducing reflectance for external light in a white sub pixel of the display panel using an organic light emitting device, and a method for manufacturing thereof.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, a display panel comprises a substrate with a plurality of color sub pixel regions and a white sub pixel region constituting a unit pixel; a color filter layer with a color filter provided in each of the plurality of color sub pixel regions; and a reflection reduction layer provided in the white sub pixel region, wherein the reflection reduction layer includes at least one color filter selected from the color filter layer, and a thickness of the reflection reduction layer is smaller than a thickness of the selected color filter.

In another aspect, a method for manufacturing a display panel preparing a substrate with a plurality of color sub pixel regions and a white sub pixel region constituting a unit pixel; forming a color filter layer in each of the plurality of color sub pixel regions on the substrate; and forming a reflection reduction layer in the white sub pixel region on the substrate, wherein a thickness of the reflection reduction layer is smaller than a thickness of the color filter layer.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Figure 1:
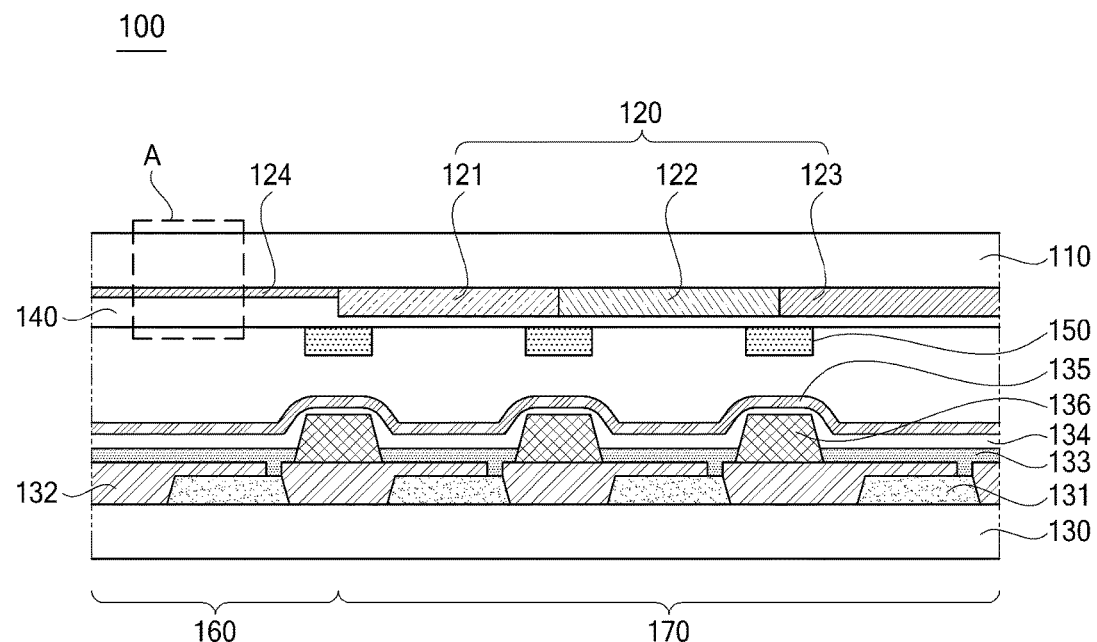
FIG. 1 is a cross sectional view illustrating a display panel according to a first example embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary. In construing an element, the element is construed as including an error region although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, a display panel according to the embodiment of the present invention and a method for manufacturing thereof will be described with reference to the accompanying drawings.

FIG. 1 is a cross sectional view illustrating a display panel according to the first embodiment of the present invention.

With reference to FIG. 1, the display panel 100 according to the first embodiment of the present invention may include a substrate 110, and a lower substrate 130 confronting the substrate 110. On the substrate 110, there are a plurality of color sub pixel regions 170 and a white sub pixel region 160 which constitute one unit pixel 180.

Each sub pixel may include a transistor 131, a pixel electrode (or anode) 133, at least one organic light emitting device 134, and a common electrode (or cathode) 135, which are provided on the lower substrate 130.

The lower substrate 130 may be formed of any one of glass, plastic and metal. In order to prevent permeation of oxygen and moisture, the lower substrate 130 may include a protection layer (or buffer layer).

The transistor 131 corresponds to a thin film transistor (TFT), which includes a semiconductor layer, a gate electrode, and a source/drain electrode. In this case, the semiconductor layer may be formed of single crystal silicon, polycrystalline silicon, or oxide. The oxide may be IGZO (Indium Gallium Zinc Oxide), ZTO (Zinc Tin Oxide), ZIO (Zinc Indium Oxide), and etc. The transistor 131 is covered by an insulating layer 132.

The pixel electrode 133 is formed on the insulating layer 132, wherein the pixel electrode 133 is electrically connected with the transistor 131. The pixel electrode 133 is separated as each unit of pixel region by a bank layer 136 patterned on the insulating layer 132. The pixel electrode 133 is supplied with a data signal via the transistor 131.

According to a light-emission type of the display panel 100, the pixel electrode 133 may be formed of a transparent material or a reflective material. That is, if a structure of the display panel 100 is a top emission type, the pixel electrode 133 may be formed of a metal-based material enabling a function as a reflecting plate for reflecting the light. Meanwhile, if a structure of the display panel 100 is a bottom emission type, the pixel electrode 133 may be formed of a transparent material (semi-transparent material) for transmitting the light therethrough. FIG. 1 illustrates the display panel 100 of the top emission type. That is, the pixel electrode 133 functions as the reflecting plate for reflecting the light emitted from the organic light emitting device 134, and also reduces deterioration of the transistor 131 caused by the light.

The organic light emitting device 134 is prepared on the pixel electrode 133. The organic light emitting device 134 emits the light by exciton which is produced by a bond between a hole injected from the pixel electrode 133 and an electron injected from the common electrode 135. In order to improve emission efficiency and stability, the organic light emitting device 134 may be formed in a multi-layered structure comprising several layers of the different materials. For example, the organic light emitting device 134 may include a hole injection layer, a hole transfer layer, at least one organic emitting layer, an electron transfer layer, and an electron injection layer. Especially, the organic light emitting device 134 provided in the white sub pixel region may be a white organic light emitting device.

The common electrode 135 is provided on the lower substrate 130, wherein the common electrode 135 is electrically connected with the organic light emitting device 134 for each sub pixel. That is, the common electrode 135 may cover the bank layer 136 and the organic light emitting device 134 in each sub pixel. The common electrode 135 may be formed of a transparent material (semi-transparent material) for transmitting the light therethrough.

The common electrode 135 may be covered by a passivation layer (or encapsulation layer, not shown). The passivation layer protects the organic light emitting device 134 from moisture or oxygen. An adhesive layer may be formed on the passivation layer.

The substrate 110 and the lower substrate 130 confronting each other are bonded to each other. According as the light emitted from the organic light emitting device 134 of each sub pixel on the lower substrate 130 is transmitted through the substrate 110, it is possible to express a color of the unit pixel 180.

The substrate 110 may be formed of glass or transparent plastic, and the substrate 110 may include the protecting layer (or buffer layer) for preventing permeation of moisture and oxygen.

The substrate 110 may include a color filter layer 120, a reflection reduction layer 124, an overcoat layer 140, and a black matrix 150.

The color filter layer 120 is provided on the substrate 110, wherein the color filter layer 120 is overlapped with each of the plurality of color sub pixel regions 170 provided on the lower substrate 130. The color filter layer 120 may include a plurality of color filters 121, 122 and 123 with the different colors. For example, each of the plurality of color filters 121, 122 and 123 may be any one selected among red, green and blue color filters, or may be a color filter of mixed color in addition to the red, green and blue color filters. The plurality of color filters 121, 122 and 123 may have various colors in accordance with a color of material used by a dye or pigment method. For example, the plurality of color filters 121, 122 and 123 may include a color filter of yellow green color.

FIG. 1 shows the color filter layer 120 comprising the red color filter 121, the green color filter 122, and the blue color filter 123, but not limited to this structure. According to the number of color sub pixels constituting the unit pixel, the color filter layer 120 may include additional color filters with colors which are different from those of the red, green and blue color filters 121, 122 and 123.

The reflection reduction layer 124 for preventing reflection of external light on the pixel electrode 133 is provided on the substrate 110, wherein the reflection reduction layer 124 is overlapped with the white sub pixel region 160 provided on the lower substrate 130. The reflection reduction layer 124 may include the color filter selected among the color filters 121, 122 and 123 of the color filter layer 120. In consideration of light transmittance and reflectance of the white sub pixel region, a thickness of the reflection reduction layer 124 is smaller than a thickness of the color filter selected among the color filters 121, 122 and 123 of the color filter layer 120.

TABLE 1

| No | Thickness (μm) | Transmittance by each wavelength (%) | | | |
|---|---|---|---|---|---|
| | | 450 nm | 520 nm | 650 nm | Ave. |
| 1 | 1.5 | 80.2 | 20.4 | 4 | 34.9 |
| 2 | 1.1 | 86.7 | 33.6 | 11.1 | 43.8 |
| 3 | 0.7 | 88.4 | 41.9 | 17.2 | 49.2 |
| 4 | 0.5 | 91.4 | 56.9 | 31.2 | 59.8 |
| 5 | 0.4 | 93.9 | 67.8 | 44.5 | 68.7 |
| 6 | 0.3 | 95.2 | 72.4 | 50.3 | 72.6 |

The above Table 1 shows experiment results for the transmittance by each wavelength band of light in accordance with the thickness of the reflection reduction layer comprising the blue color filter. In the above Table 1, 1~6 of the number line (No) indicate the experiment number by each thickness of the reflection reduction layer.

Referring to the above Table 1, if a deposition thickness of the reflection reduction layer 124 is not more than 0.5 μm, the transmittance for each wavelength band is 30% or more than 30%. Accordingly, if the thickness of the reflection reduction layer 124 overlapped with the white sub pixel region 160 is not more than 0.5 μm, it is possible to maintain white light in the white sub pixel region 160.

TABLE 2

| No | Thickness (μm) | Reflectance (%) |
|---|---|---|
| 1 | (No) | 21.6 |
| 2 | (No) | 22.0 |
| 3 | (No) | 22.2 |
| 4 | 0.5 | 13.5 |
| 5 | 0.4 | 15.4 |
| 6 | 0.2 | 15.6 |

The above Table 2 shows experiment results for the reflectance of external light in accordance with the thickness of the reflection reduction layer. In the above Table 2, 1~6 of the number line (No) indicate the experiment number by each thickness of the reflection reduction layer.

Referring to the above Table 2, if there is no reflection reduction layer 124, the reflectance for the external light is 20% or more than 20%. Meanwhile, if there is the reflection reduction layer 124, the reflectance for the external light is reduced by 30% in comparison to the reflectance when there is no reflection reduction layer 124, as shown in the experiment numbers 4 to 6.

As shown in the above Tables 1 and 2, it is preferable that the reflection reduction layer 124 have the thickness of 0.5 μm or less than 0.5 μm and the reflection reduction layer 124 overlap with the white sub pixel region 160.

The overcoat layer 140 for covering the color filter layer 120 and the reflection reduction layer 124 is provided on the substrate 110. The overcoat layer 140 may be provided to planarize an upper surface of the color filter layer 120 and the reflection reduction layer 124 being stepped, but not necessarily.

The black matrix 150 defines each sub pixel region, and also prevent the colors of the sub pixels from being mixed. The black matrix 150 may be provided on a front surface of the substrate 110 or overcoat layer 140 while being overlapped with a boundary line between the close sub pixel regions.

Figure 2A:
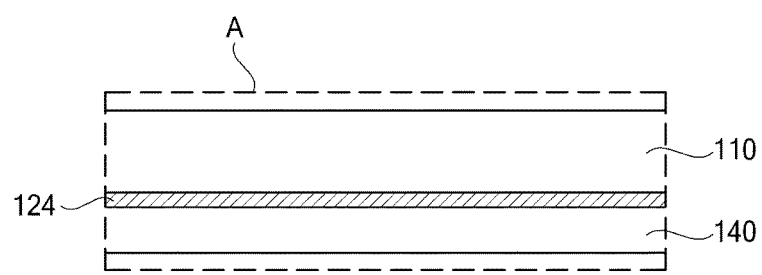
FIG. 2A is an expanded view illustrating 'A' of FIG. 1, which is a cross sectional view illustrating a reflection reduction layer according to one embodiment of the present invention.
Figure 2B:
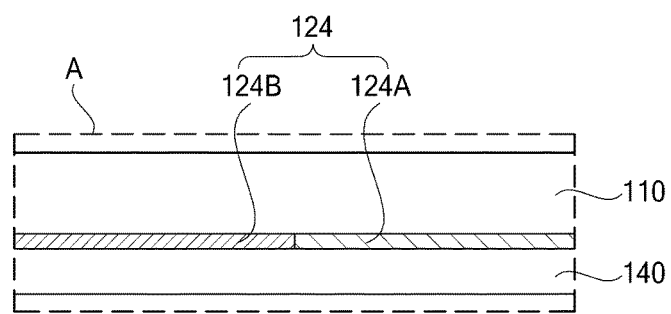
FIG. 2B is an expanded view illustrating 'A' of FIG. 1, which is a cross sectional view illustrating a reflection reduction layer according to another embodiment of the present invention.

FIGS. 2A and 2B are expanded views illustrating 'A' of FIG. 1, wherein FIG. 2A is a cross sectional view illustrating the reflection reduction layer according to one embodiment of the present invention, and FIG. 2B is a cross sectional view illustrating the reflection reduction layer according to another embodiment of the present invention.

As shown in FIG. 2A, the reflection reduction layer 124 according to one embodiment of the present invention may comprise one thin color filter. In this case, one thin color filter may be any one selected among the color filters 121, 122 and 123 of the color filter layer 120 provided in the color sub pixel region 170. The reflection reduction layer 124 according to one embodiment of the present invention may be covered by the overcoat layer 140.

As shown in FIG. 2B, the reflection reduction layer 124 according to another embodiment of the present invention may comprise first and second color filters 124a and 124b being in parallel to each other. The first color filter 124A may be any one color filter selected among the color filters 121, 122 and 123 of the color filter layer 120 provided in the color sub pixel region 170, and the second color filter 124B may be another color filter which has a complementary color of the first color filter 124A.

Although not shown, the reflection reduction layer 124 according to another embodiment of the present invention may be formed in a dual-layered structure comprising two color filters whose colors complement each other so as to maintain white color in the white sub pixel region 160.

Figure 3:
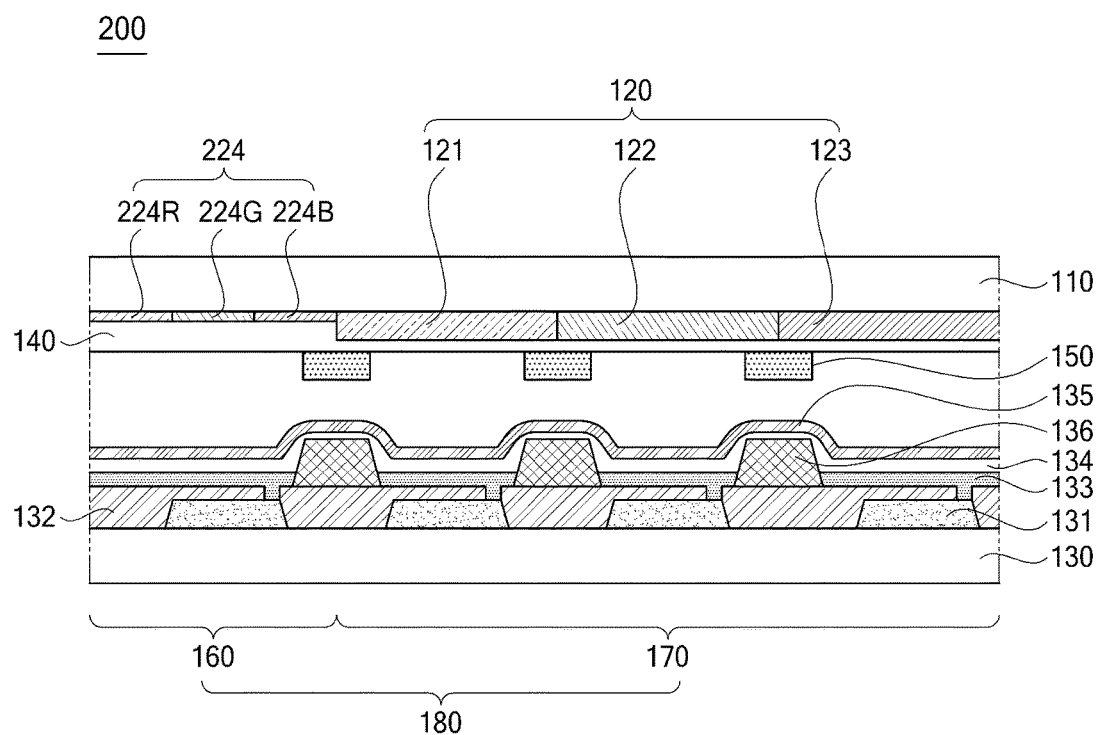
FIG. 3 is a cross sectional view illustrating a display panel according to a second example embodiment of the present invention.

FIG. 3 is a cross sectional view illustrating a display panel according to the second embodiment of the present invention, which is obtained by changing a structure of the reflection reduction layer in the display panel according to the first embodiment of the present invention. Accordingly, only the reflection reduction layer will be described in detail, and a detailed description for the other parts except the reflection reduction layer will be omitted.

A reflection reduction layer 224 comprises at least two selected among a red color filter 121, a green color filter 122 and a blue color filter 123 included in a color filter layer 120 of a color sub pixel region 170, wherein a thickness of the reflection reduction layer 224 is smaller than a thickness of the corresponding color filter. That is, in order to prevent a red, green or blue wavelength in white light being emitted from an organic light emitting device 134 of a white sub pixel and transmitted through the reflection reduction layer 224, the thickness of the reflection reduction layer 224 is smaller than the thickness of the color filter of the color filter layer 120, preferably. For example, the reflection reduction layer 224 may include a red color filter 224R, a green color filter 224G or a blue color filter 224B being overlapped with the white sub pixel region 160.

The respective red, green and blue color filters 224R, 224G and 224B are disposed in parallel on the white sub pixel region 160. In this case, the respective red, green and blue color filters 224R, 224G and 224B may have the same or different area ratio so that light emitted from an organic light emitting layer 234 of the white sub pixel region 160, which is transmitted through the reflection reduction layer 224, is displayed as a white color corresponding to the white color coordinates or white balance preset in the white sub pixel region 160.

FIG. 3 briefly shows the reflection reduction layer 224. However, the reflection reduction layer 224 may include the blue color filter 224B. The blue color filter 224B of the reflection reduction layer 224 may occupy 30~50% in the area of the reflection reduction layer 224, that is, the area of the white sub pixel region 160. In this case, the reflectance for the external light in the white sub pixel region 160 may be more reduced.

Also, the reflection reduction layer 224 may include the green color filter 224G. The green color filter 224G of the reflection reduction layer 224 may occupy 30~50% in the area of the reflection reduction layer 224, that is, the area of the white sub pixel region 160. In this case, it is possible to improve luminance of the white sub pixel region 160.

FIGS. 4A to 4G are cross sectional views illustrating a method of manufacturing the display panel according to the first embodiment of the present invention.

First, the substrate on which the plurality of color sub pixel regions and the white sub pixel region constituting each unit pixel are formed is prepared.

Figure 4A:
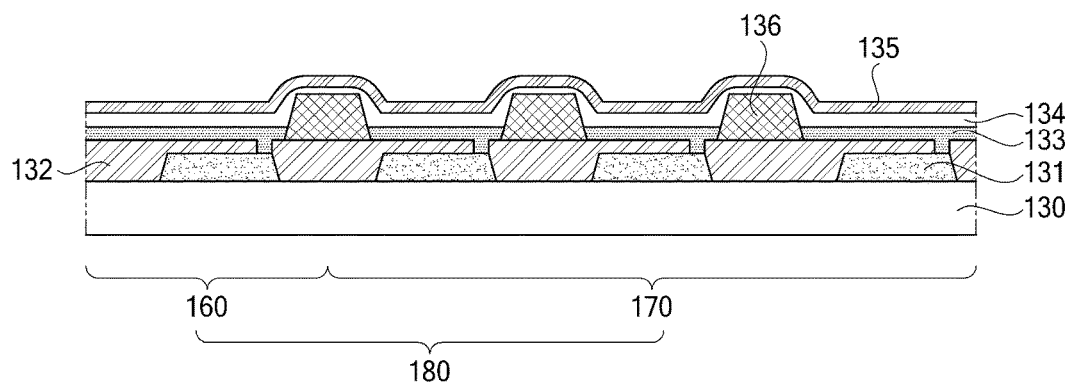
FIGS. 4A to 4G are cross sectional views illustrating a method of manufacturing the display panel according to the first embodiment of the present invention.

Thereafter, as shown in FIG. 4A, the transistor 131, the insulating layer 132, the pixel electrode 133, the bank layer 136, the organic light emitting device 134 and the common electrode 135 are sequentially provided on the lower substrate 130, whereby the unit pixel 180 comprising the plurality of color sub pixel regions 170 and the white sub pixel region 160 is prepared on the lower substrate 130. Drawings for showing a detailed structure for each element will be omitted.

Figure 4B:
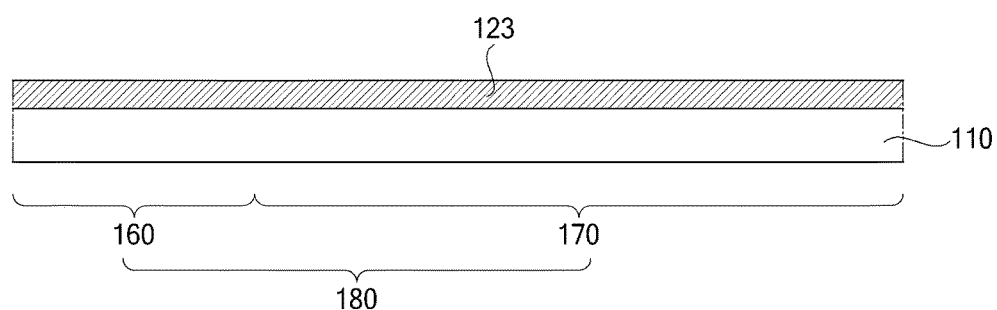
Figure 4C:
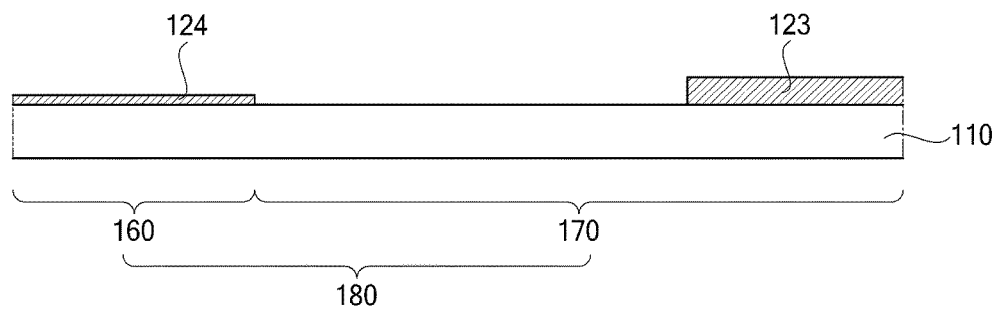

Then, as shown in FIGS. 4B and 4C, the blue color filter 123 is formed on the substrate 110. The blue color filter 123 and the reflection reduction layer 124 are simultaneously formed by a dry etching method using a mask including a halftone mask.

Figure 4D:
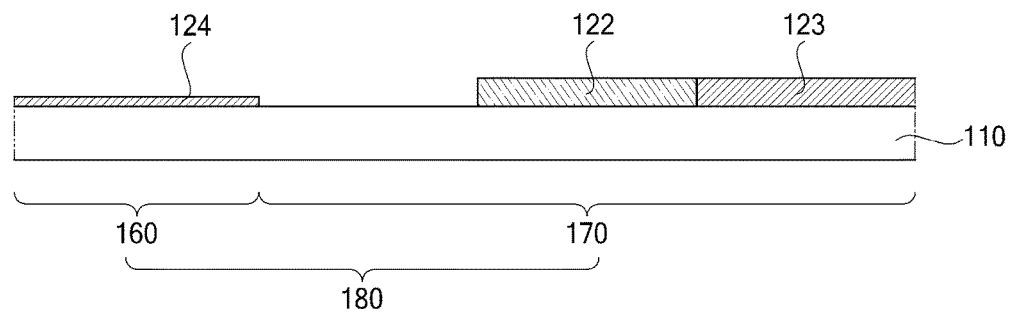
Figure 4E:
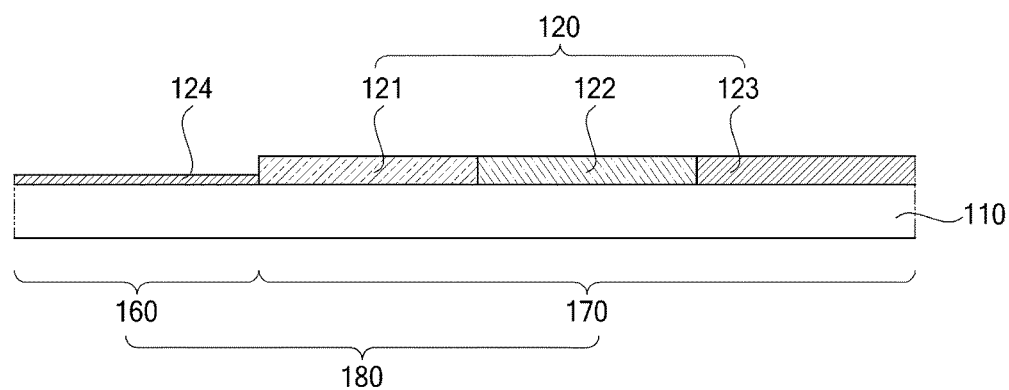

As shown in FIG. 4D and 4E, the green color filter 122 and the red color filter 121 are sequentially formed on the substrate 110.

Figure 4F:
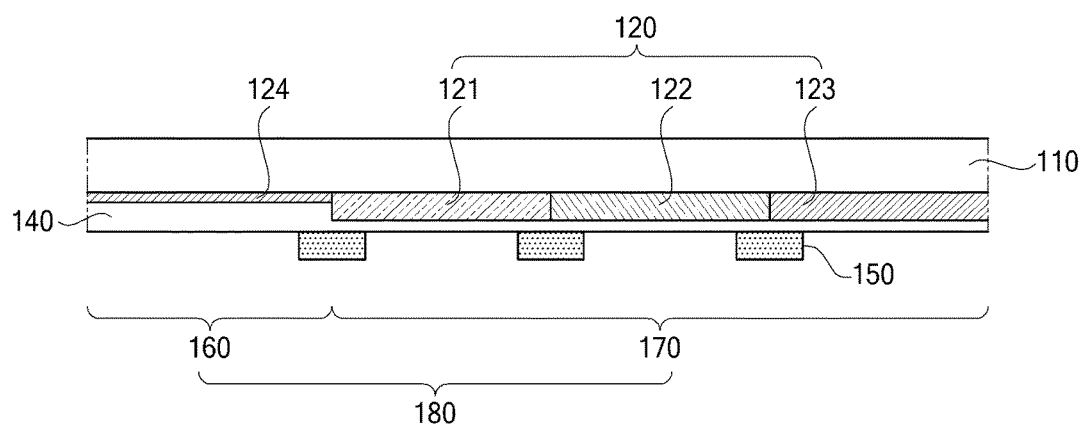

As shown in FIG. 4F, the overcoat layer 140 and the black matrix 150 are formed on the substrate 110 with the color filter layer 120 and the reflection reduction layer 124.

Figure 4G:
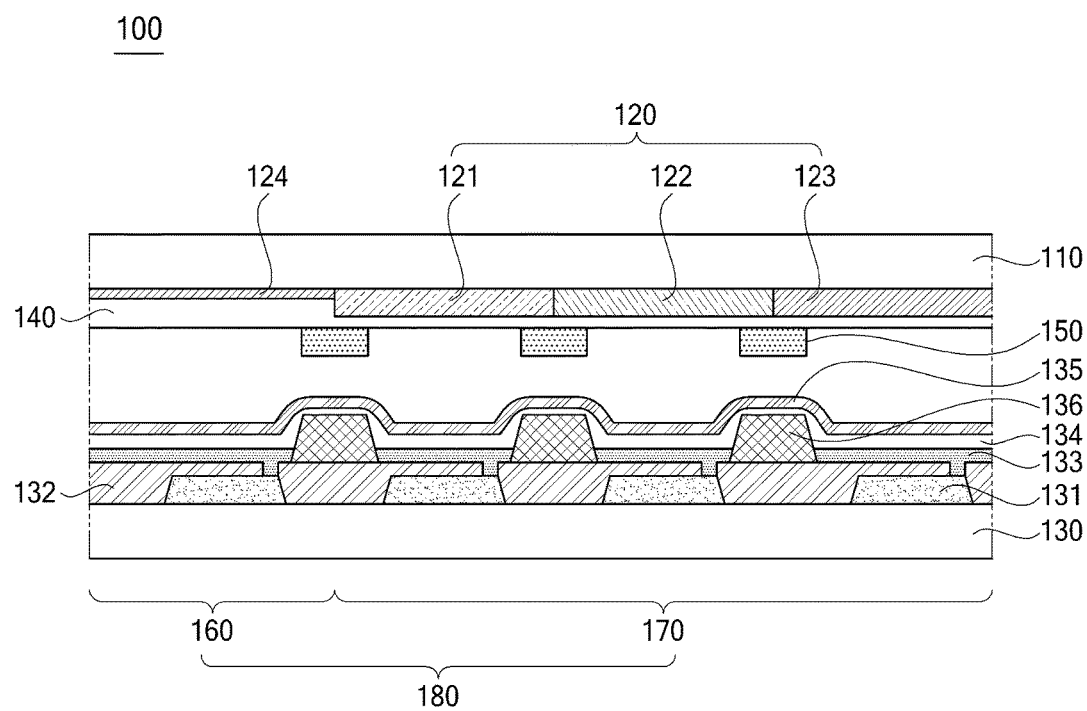

Then, as shown in FIG. 4G, the substrate 110 and the lower substrate 130 are bonded to each other, to thereby form the display panel 100.

Figure 5:
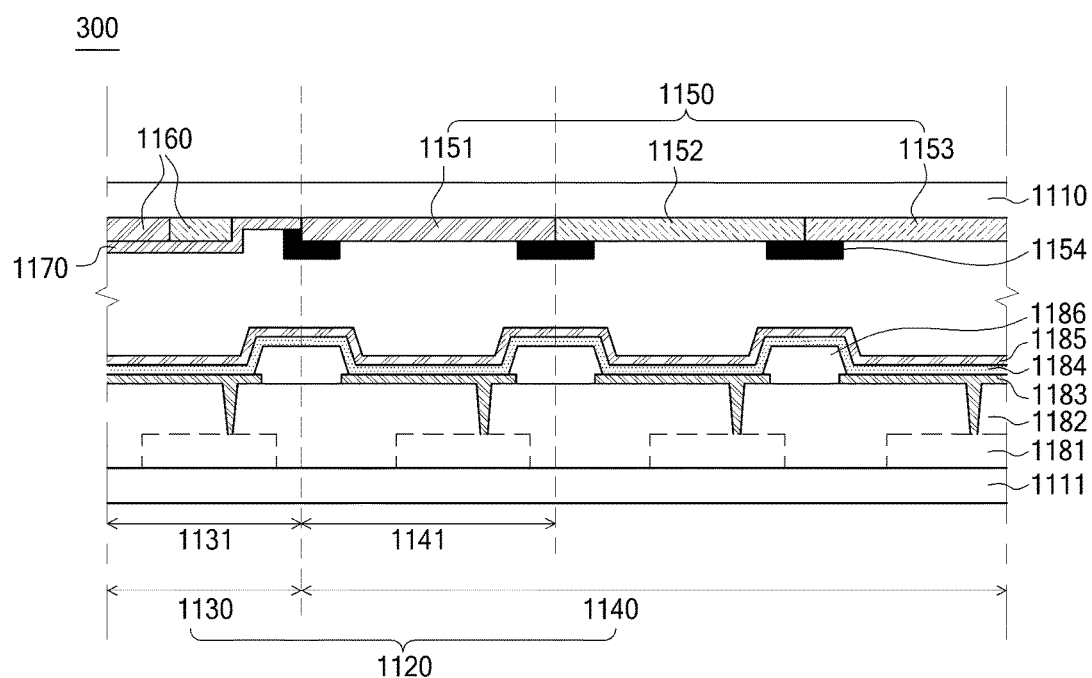
FIG. 5 is a cross sectional view illustrating a display panel according to a third example embodiment of the present invention.

FIG. 5 is a cross sectional view illustrating a display panel according to the third embodiment of the present invention, which is obtained by additionally forming a white balance layer in the white sub pixel region of the display panel according to the second embodiment of the present invention.

Except the white balance layer, a structure of the display panel will be briefly described with reference to FIG. 5.

The display panel 300 according to the third embodiment of the present invention may include a unit pixel 1120 defined by a white sub pixel region 1130 and a color sub pixel region 1140.

The white sub pixel region 1130 includes a white sub pixel 1131, and the color sub pixel region 1140 includes at least one color sub pixel 1141. The white sub pixel 1131 and the color sub pixel 1141 include at least one driving device (or thin film transistor) 1181 on a substrate 1111. Each sub pixel is controlled by the driving device 1181. The driving device 1181 is connected with an organic light emitting device, and more particularly, a pixel electrode 1183 formed on an insulating layer 1182.

On the pixel electrode 1183, there are an organic light emitting layer 1184 and a common electrode 1185. The pixel electrode 1183 is separated by a bank layer 1186.

The display panel 300 according to the third embodiment of the present invention includes another substrate 1110 confronting the substrate 1111.

The substrate 1110 includes a color filter layer 1150, a reflection reduction layer 1170, the white balance layer 1160 and a black matrix 1154.

The color filter layer 1150 is prepared on the substrate 1110, and is overlapped with each color sub pixel 1141 of the color sub pixel region 1140. The color filter layer 1150 includes a color filter with a color defined in the corresponding color sub pixel 1141. For example, the color filter layer 1150 may include the color filter selected among a red color filter 1151, a green color filter 1152 and a blue color filter 1153 in accordance with the corresponding color sub pixel 1141.

The reflection reduction layer 1170 is prepared on the substrate 1110, and is overlapped with the white sub pixel region 1130. An area of the reflection reduction layer 1170 may correspond to an area of the white sub pixel region 1130. The reflection reduction layer 1170 may be formed of the same material as that of the color filter selected among the red color filter 1151, the green color filter 1152 and the blue color filter 1153 prepared in the color filter layer 1150. In order to reduce a reflection for external light in the white sub pixel region 1130 and to minimize a wavelength change of light transmitted through the white sub pixel region 1130, it is preferable that a thickness of the reflection reduction layer 1170 be smaller than a thickness of the color filter layer 1150. That is, in order to prevent the light being emitted from the organic light emitting layer 1184 of the white sub pixel 1131 and transmitted through the reflection reduction layer 1170 from being visible as a wavelength of red, green or blue color, the thickness of the reflection reduction layer 1170 is smaller than the thickness of the color filter of the color filter layer 1150, preferably.

The white balance layer 1160 is provided between the substrate 1110 and the reflection reduction layer 1170, and is overlapped with the reflection reduction layer 1170, whereby it is possible to reduce a reflectance for the external light in the white sub pixel region 1130, thereby improving visibility. To this end, the white balance layer 1160 may include at least one color filter segment selected from the red color filter and the green color filter in consideration of the color in the color filter adopted to the reflection reduction layer 1170, whereby the light transmitted through the reflection reduction layer 1170 may be more clearly visible as a white color.

A thickness of the white balance layer 1160 may be the same as or smaller than a thickness of the color filter layer 1150. Also, an area of the white balance layer 1160 is smaller than an area of the reflection reduction layer 1170. More particularly, the white balance layer 1160 may occupy 30~70% in the area of the white sub pixel region 1130. In the white sub pixel region 1130, some of the reflection reduction layer 1170 is formed on the white balance layer 1160, and the remaining of the reflection reduction layer 1170 is formed on a confronting surface of the substrate 1110 which confronts the substrate 1111. That is, the reflection reduction layer 1170, which is formed on the confronting surface of the substrate 1110, covers the white balance layer 1160 in the white sub pixel region 1130.

The white balance layer 1160 may include a color filter whose color is different from the color of the color filter adopted to the reflection reduction layer 1170.

The white balance layer 1160 prevents a specific color from being emphasized in the white sub pixel 1131 by the reflection reduction layer 1170 when the white and black colors are displayed on the display panel 300, thereby obtaining more more-realized white and black colors.

A width of the white balance layer 1160 may be adjusted in accordance with the color of the color filter adopted to the reflection reduction layer 1170, to thereby adjust a white balance of the white sub pixel region 1130.

Figure 6:
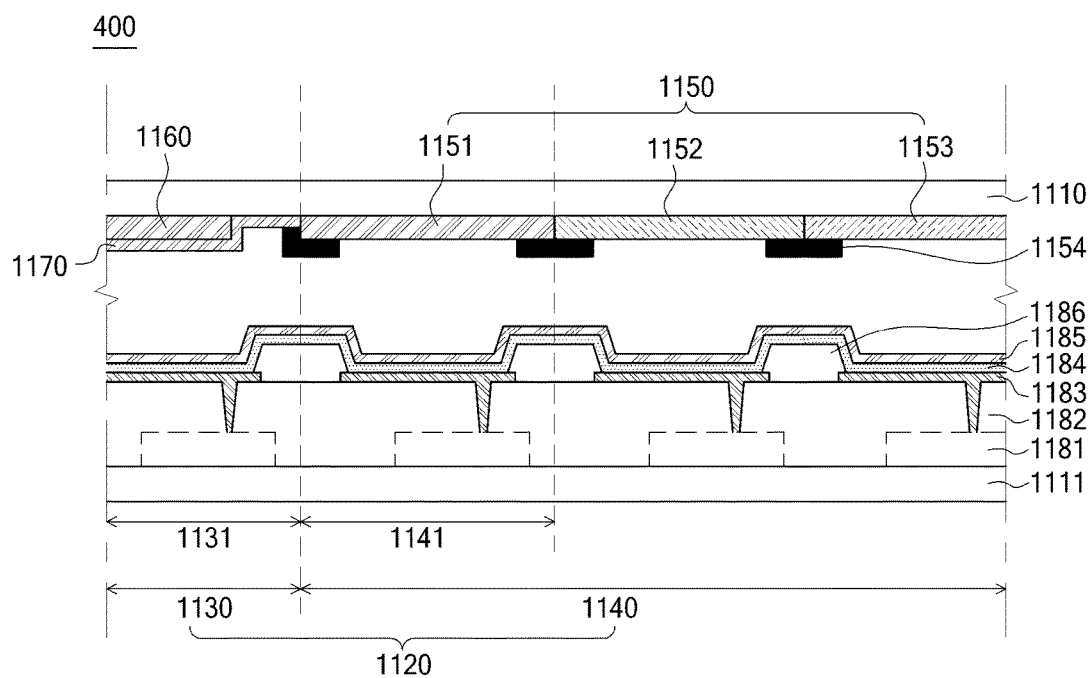
FIG. 6 is a cross sectional view illustrating a display panel according to a fourth example embodiment of the present invention.

FIG. 6 is a cross sectional view illustrating a display panel according to the fourth embodiment of the present invention, which is obtained by changing a structure of the white balance layer of the display panel according to the third embodiment of the present invention. Accordingly, only the white balance layer will be described in detail, and a detailed description for the other parts except the reflection reduction layer will be omitted.

In the display panel 400 according to the fourth embodiment of the present invention, a white balance layer 1160 may comprise a color filter with a color adopted to a color filter layer 1150, or may comprise a color filter with a mixed color of two colors. For example, the white balance layer 1160 may be the color filter with the mixed color of red and green colors.

A width or thickness of the white balance layer 1160 may be changed in accordance with the color of the color filter adopted to a reflection reduction layer 1170 so as to adjust a white color (or white balance) of a white sub pixel region 1130.

Figure 7A:
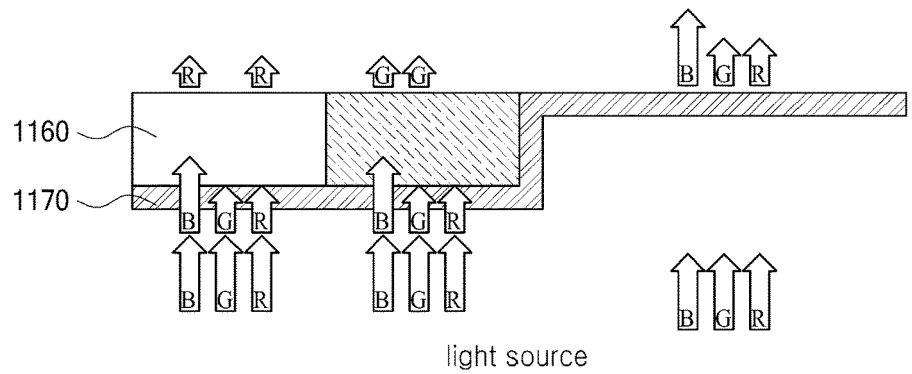
FIGS. 7A to 7C are cross sectional views illustrating a white balance layer of a white sub pixel region in the display panels according to the third and fourth embodiments of the present invention.
Figure 7B:
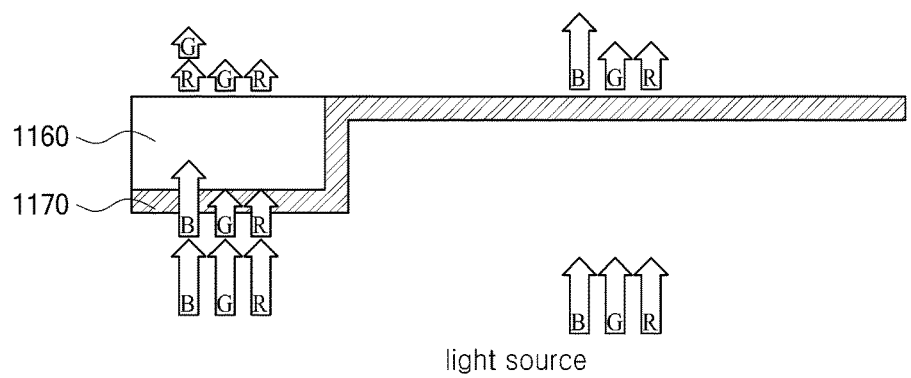
Figure 7C:
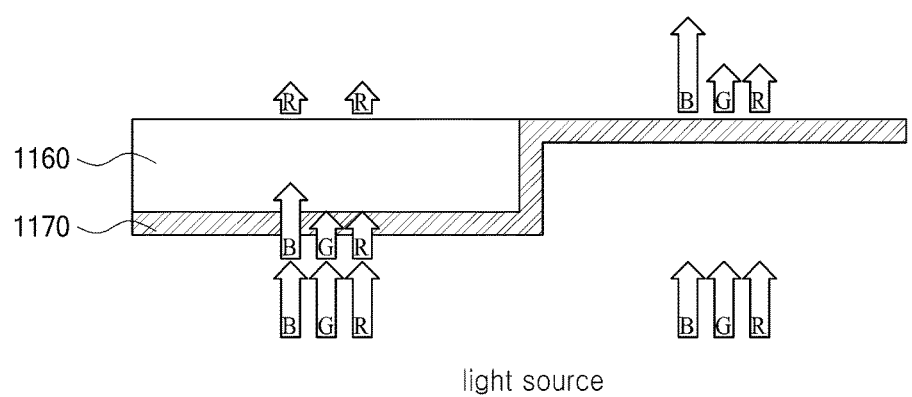

FIGS. 7A to 7C are cross sectional views for explaining the white balance of white sub pixel in the display panels according to the third and fourth embodiments of the present invention.

In FIG. 7A, the reflection reduction layer 1170 may be formed of the blue color filter, and the white balance layer 1160 may be formed of the red and green color filters overlapped with the reflection reduction layer 1170 and provided in parallel to each other. Hereinafter, when the light emitted from a light source with red (R), green (G) and blue (B) wavelengths is transmitted through the reflection reduction layer 1170 and the white balance layer 1160, the white balance of the white sub pixel will be described.

As the reflection reduction layer 1170 is formed of the blue color filter, the light of blue wavelength is intactly transmitted through the blue color filter, however, the light of green wavelength and the light of red wavelength is reduced and transmitted therethrough.

The white balance layer 1160 transmits the light of red wavelength and the light of green wavelength. That is, the white balance layer 1160 is formed of the red color filter and the green color filter, whereby the light of blue wavelength transmitted through the reflection reduction layer 1170 is converted into the light of red wavelength and the light of green wavelength.

Eventually, an intensity of the light (R, G, B) transmitted only through the reflection reduction layer 1170 and an intensity of the light (R, G) transmitted through the reflection reduction layer 1170 and the white balance layer 1160 are maintained constantly so that the light transmitted through the white sub pixel is maintained as the white color.

The white balance layer 1160 may be formed of the plurality of color filters in accordance with the thickness of the reflection reduction layer 1170, and the thickness and/or width of the white balance layer 1160 may be adjustable.

Accordingly, the ratio (or intensity) of the red, green and blue wavelengths of the light transmitted through the reflection reduction layer 1170 and the white balance layer 1160 may be adjusted so that the white balance of the light transmitted through the white sub pixel may be maintained.

Referring to FIGS. 7B and 7C, the white balance layer 1160 may be formed of the color filter with the mixed color of red and green colors, or may be formed of the color filter of the single color.

FIG. 7B shows that the white balance layer 1160 uses the color filter with the mixed color of the red and green colors. In this case, the white balance is maintained by the light transmitted through the reflection reduction layer 1170 and the white balance layer 1160 together with the wavelength of the light of the green wavelength and the red wavelength which is not transmitted through the white balance layer 1160. That is, the intensity of the light (R, G, B) transmitted only through the reflection reduction layer 1170 and the intensity of the light (R, G) transmitted through the reflection reduction layer 1170 and the white balance layer 1160 are constantly maintained so that the light transmitted through the white sub pixel is maintained as the white color.

FIG. 7C shows that the white balance layer 1160 uses the single color filter. In this case, the white balance is maintained by the light transmitted through the reflection reduction layer 1170 together with the wavelength of the light transmitted through the reflection reduction layer 1170 and the white balance layer 1160. That is, the intensity of the light (R, G, B) transmitted only through the reflection reduction layer 1170 and the intensity of the light (R) transmitted through the reflection reduction layer 1170 and the white balance layer 1160 are constantly maintained so that the light transmitted through the white sub pixel is maintained as the white color.

According to the present invention, the reflection reduction layer is provided in the white sub pixel region of the display panel so that it is possible to maintain the color of white sub pixel, to lower the reflectance for the external light, and to improve the external visibility for the display panel.

Also, the reflection reduction layer and the white balance layer are provided in the white sub pixel region of the display panel, to thereby lower the reflectance for the external light and to adjust the white balance of the white sub pixel.

According as the reflectance for the external light is lowered, it is possible to realize the display panel with slimness by removing the polarizing plate which is necessarily required for improvement of visibility.

It will be apparent to those skilled in the art that various modifications and variations can be made to embodiments of the present invention without departing from the spirit or scope of the invention. Thus, it is intended that the present invention covers the modifications and variations of this invention provided they come within the scope of the appended claims and their equivalents.

What is claimed is:
1. A display panel, comprising:
   a substrate including a unit pixel including:
      a plurality of color sub pixel regions; and
      a white sub pixel region;
   a color filter layer including a color filter provided in each of the plurality of color sub pixel regions;
   a reflection reduction layer provided in the white sub pixel region;
   a white balance layer over and vertically overlapping the reflection reduction layer and provided in the white sub pixel region,
   wherein the reflection reduction layer includes at least one color filter selected from the color filter layer,
   wherein a thickness of the reflection reduction layer is smaller than a thickness of the selected at least one color filter,
   wherein an area of the white balance layer is smaller than an area of the reflection reduction layer,
   wherein the white balance layer includes another color filter that is different from the at least one color filter of the reflection reduction layer, and
   wherein the white sub pixel region includes:
      a first region including the white balance layer on the reflection reduction layer, and
      a second region including the reflection reduction layer directly contacting the substrate, the second region not including the white balance layer.
2. The display panel of claim 1, wherein:
   the color filter layer comprises red, green, and blue color filters respectively corresponding to the plurality of color sub pixel regions; and
   the reflection reduction layer comprises:
      a first color filter selected among the red, green, and blue color filters; and
      a second color filter having a complementary color of the first color filter.
3. The display panel of claim 1, wherein:
   an area of the reflection reduction layer corresponds to an area of the white sub pixel region; and
   the white balance layer occupies 30~70% of the area of the white sub pixel region.
4. The display panel of claim 1, wherein the reflection reduction layer completely surrounds the white balance layer in the white sub pixel region.
5. The display panel of claim 1, wherein:
   the white sub pixel region includes:
      a first area including a multi-layer including the first region; and
      a second area including a single-layer including the second region;
   the white balance layer is in the first area; and
   the reflection reduction layer overlaps the white balance layer in the first area.
6. A display apparatus, comprising:
   a lower substrate including an array of pixels, each pixel of the array of pixels including:
      first through fourth sub-pixels, each of the first through fourth sub-pixels including an organic light emitting element; and
      a common cathode over the organic light emitting element of the each of the first through fourth sub-pixels across the array of pixels; and
   an upper substrate, over the lower substrate, including color filtering layers corresponding to the array of pixels,
   wherein the first sub-pixel includes a first color filtering layer,
   wherein the second sub-pixel includes a second color filtering layer,
   wherein the third sub-pixel includes a third color filtering layer,
   wherein the fourth sub-pixel includes:
      a first area,
      a second area, a reflection reduction layer in the first area and the second area, the reflection reduction layer directly contacting the upper substrate and including at least one color filter corresponding to the first to third color filtering layers, and a white balance layer stacked on the reflection reduction layer in the second area, the white balance layer not being disposed in the first area, and wherein the white balance layer includes another color filter that is different from the at least one color filter of the reflection reduction layer.

7. The display apparatus of claim 6, wherein the reflection reduction layer:

directly contacts the upper substrate in the first area; and
completely surrounds the white balance layer in the fourth sub-pixel.

8. The display apparatus of claim 6, wherein a color of light transmitted through the first area is different from a color of light transmitted through the second area.

9. The display apparatus of claim 8, wherein:

the color of the light transmitted through the first area is a white color; and
the color of the light transmitted through the second area is one color or two mixed colors among a red color, a green color, and a blue color.

10. The display apparatus of claim 9, wherein the color of the light transmitted through the first area is the white color due to a mixture of a red color light, a green color light, and a blue color light.

11. The display apparatus of claim 10, wherein, in the light transmitted through the first area, an intensity of the blue color light is greater than an intensity of the red color light and an intensity of the green color light.

12. A display apparatus, comprising:

a substrate including a unit pixel including:
a plurality of color sub pixel regions; and
a white sub pixel region;
a reflection reduction layer in the white sub pixel region; and
a white balance layer on the reflection reduction layer in the white sub pixel region,
wherein the reflection reduction layer:
includes at least one color filter corresponding to a color of one of the plurality of color sub pixel regions,
directly contacts the substrate, and
completely surrounds the white balance layer in the white sub pixel region, and
wherein the white balance layer includes another color filter that is different from the at least one color filter of the reflection reduction layer.

13. The display apparatus of claim 12, wherein:

the white sub pixel region includes a first area and a second area configured to transmit light;
the white balance layer is in the second area; and
the reflection reduction layer:
directly contacts the substrate in the first area, and
overlaps the white balance layer in the second area.

14. The display apparatus of claim 13, wherein a color of light transmitted through the first area is different from a color of light transmitted through the second area.

15. The display apparatus of claim 14, wherein:

the color of the light transmitted through the first area is a white color; and
the color of the light transmitted through the second area is one color or two mixed colors among a red color, a green color, and a blue color.

16. The display apparatus of claim 15, wherein the color of the light transmitted through the first area is the white color due to a mixture of a red color light, a green color light, and a blue color light.

17. The display apparatus of claim 16, wherein, in the light transmitted through the first area, an intensity of the blue color light is greater than an intensity of the red color light and an intensity of the green color light.

18. The display apparatus of claim 12, wherein each of the plurality of color sub pixel regions and the white sub pixel region respectively includes:

an organic light emitting element, and
a common cathode over the organic light emitting element of the each of the plurality of color sub pixel regions and the white sub pixel region.

19. The display apparatus of claim 18, further comprising a color filter layer including a color filter in each of the plurality of color sub pixel regions.

\* \* \* \* \*